United States Patent [19]

Biggs et al.

[11] Patent Number: 4,645,118

[45] Date of Patent: Feb. 24, 1987

[54] METHOD AND MEANS FOR THREADING WIRE BONDING MACHINES

[76] Inventors: Kenneth L. Biggs, 3407 N. Valley View, Orange, Calif. 92667; C. Fredrick Miller, 1551 E. Pacifico Ave., Anaheim, Calif. 92805

[21] Appl. No.: 770,618

[22] Filed: Aug. 29, 1985

[51] Int. Cl.[4] .................... B23K 31/02; B23K 37/00; D05B 53/00; D05B 87/02

[52] U.S. Cl. .................... 228/170; 228/179; 228/4.5; 112/225

[58] Field of Search .................... 228/4.5, 179, 170; 112/225, 224

[56] References Cited

U.S. PATENT DOCUMENTS

| 638,701 | 12/1899 | Childers | 112/225 |
| 1,072,601 | 9/1913 | Girard | 112/225 |
| 3,648,354 | 3/1972 | Mashino et al. | 228/4.5 |
| 3,689,983 | 9/1972 | Eltzroth et al. | 228/4.5 |
| 4,068,371 | 1/1978 | Miller | 228/179 |
| 4,069,961 | 1/1978 | Nicklaus et al. | 228/4.5 |

FOREIGN PATENT DOCUMENTS 5156 of 1905 United Kingdom ................ 112/225

Primary Examiner—Nicholas P. Godici
Assistant Examiner—Samuel M. Heinrich
Attorney, Agent, or Firm—Grover A. Frater

[57] ABSTRACT

Semiautomatic threading of bonding wire into the guide hole of a wire bonding tool is accomplished by holding the end of the wire in a reference position while its standing part is disposed in the wire feed mechanism of the machine and by activating the feed mechanism after the tool and work positioning mechanism of the machine have placed the bonding tool in line with the wire proximate to the wire end. A preferred apparatus for holding the end of the wire in place is a structure which forms a ledge and has a notch in the edge of that ledge.

6 Claims, 6 Drawing Figures

METHOD AND MEANS FOR THREADING WIRE BONDING MACHINES

TECHNICAL FIELD

This invention relates to methods and means for threading bonding wire into the guide hole of the bonding tool of a wire bonding machine.

BACKGROUND ART

"Wire bonding machine" is the name given in the semiconductor industry to a class of machines used to complete electrical connections by bonding the ends of lengths of very fine, uninsulated wires to terminal pads on a semiconductor chip to other elements of the circuit of which the chip is a part. In a majority of cases the actual bonding is accomplished by holding the wire with its side held against the surface to which it is to be bonded and then applying sonic energy to the wire. The wire is held in place and the energy is applied to the wire by a "bonding tool". The bonding tool serves the additional functions of positioning the end of the wire over the circuit point at which the end is to be bonded and shaping and directing the wire as it is extended from the bond at a first circuit point to the point at which the second bond is to be made. Moreover, the tool is often employed in the process of severing the wire after the second bond is completed.

To perform these several tasks the working face of the tool may be formed with grooves by which the wire is centered under the face. It may be formed with a sharp edge at the heel or rear of the face to aid in nicking and breaking the wire after completion of the second bond of a wire run. In almost every case it will be formed with a guide hole through which the wire is threaded and by which the direction of the wire is controlled as it is paid out. Because the wire extends through the hole, somewhat like a thread extends through the eye of its needle, wire position and direction can be determined by movement of the tool. However, unlike the eye of the needle, the guide hole of a bonding tool does not extend through the shaft from side to side. It extends instead from an opening at the rear side of the tool to an opening in the bottom face of the tool.

The bonding tool is used in conjunction with a wire clamp. The relation of tool and clamp varies in different machines but in general the clamp may be opened and closed independently of tool movement and it is moved up and down and backward and forward with the bonding tool. In addition it can be moved toward and away from the guide hole on a line of movement which coincides with the axis of the guide hole or at least intersects that axis in the vicinity of the guide hole entrance.

The wire, usually gold or aluminum, may be only one mil or less in diameter and the face of the tool may be only a few mils square. They and the circuit points to which bonds are made are so small that they must be viewed through a stereo microscope. The work and the tool are necessarily viewed from the front which is the side of the tool opposite the clamp. The guide hole entrance opening is at the rear of the tool and the exit opening is at the bottom. Neither opening is visible except with the aid of a mirror.

Threading the bonding wire into the guide hole of the tool is a difficult task which is often long and frustrating. Although bonding machines have been used for many years, threading has always been done by hand because no automatic threading technique or apparatus has been devised previously or, in any event, has not been available commercially.

SUMMARY OF THE INVENTION

It is an object of the invention to provide an improved process for threading bonding wire through the guide hole of the bonding tool of wire bonding machines.

Another object is to make the process partially automatic using the ability of the bonding machine to remember and reproduce bonding tool and work table motions.

A further object is to permit semiautomatic threading of bonding machine tools using a minimum of added apparatus and in preferred form no more than a simple small plate having a notch in one of its edges.

These and other objects of the invention are realized in part by the provision of a method in which the end of a wire to be threaded into the guide hole of a bonding machine tool is maintained in a reference position while the standing part of the wire is disposed such that it can be fed or driven in the direction of its length by the machine and is so driven after the bonding tool is positioned so that the entrance opening of its guide hole is aligned with the wire and is adjacent the wire end.

THE DRAWINGS

DESCRIPTION OF THE PREFERRED MODE AND EMBODIMENT

Figure 1:
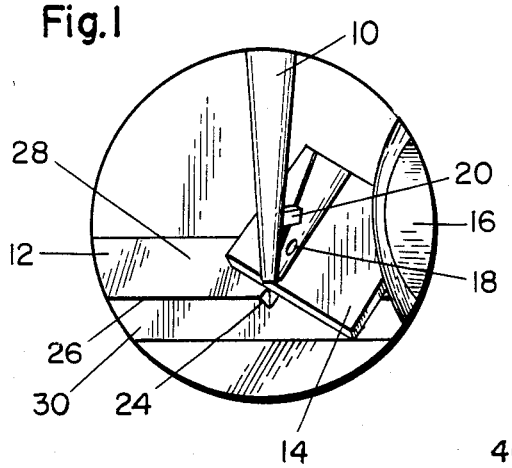
FIG. 1 is a schematic representation of what an operator is able to see in the eye pieces of a microscope during the course of practicing the invention.

In the typical case in which a wire bonding machine is used, the tool, the bonding wire and the circuit points to which conductor wires are to be bonded are all far to small to be seen without enlargement. It is industry practice to view the work space through a stereo microscope. FIG. 1 represents the view through the microscope of a typical bonding machine except that in this case instead of the workpiece being visible, the bonding tool 10 is shown resting at the reference position of a special threading structure 12. The view is seen from the operator's position looking downward at the front of the machine. In this case the work station and the threading structure are mounted on a movable table and the bonding tool remains in the center of the field of view. The table is capable of motion in the X direction to the left and right and in the Y direction toward and away from the operator. The tool, and a wire clamp which is hidden from view behind it, may be moved up and down in the Z direction toward and away from the table. The wire and the guide hole are also hidden from view. A mirror such as mirror 14 and a tweezer tapered to a very sharp point are standard tools for threading the tool. In FIG. 1 the numeral 16 identifies part of a thumb with which the mirror is held and adjusted. The entrance 18 of the guide hole and part 20 of the wire clamp are shown reflected in the mirror.

The threading structure in this case is a short length of metal plate lying flat against, and fixed to, the surface of the work table just behind the work area. There is a small notch 24 formed in the mid region along the length of the bar in the upper, forward edge 26 where the upper face 28 joins the forward wall 30. The upper face 28 serves as a ledge on which the tool is rested at the beginning of the threading process. In the course of the method the depth of the tool, if not otherwise known, may be measured by determining how far forward the tool must be moved from the reference position it is shown to occupy in FIG. 1 before the back edge of the tool clears the edge 26 and can be lowered down in front of face 30.

Wire bonding tools which are equipped to duplicate bonding tasks incorporate some means by which the distances through the tool or work is moved is measured and remembered. It is common to employ stepping motors to move the tool and work elements and in such a case distances are measured and movement is reproduced in terms of the number of pulses of energy that are applied to the motor. The pulses supplied to the motors that move an element from a reference position to another position are easily counted and the numbers recorded. To reproduce motion of an element it is required only to place the element at the reference position and to apply the previously counted number of pulses to the stepping motors that produced the initial motion. This invention provides a method for making an initial determination of what motions of tool and workpiece and wire clamp are required to accomplish threading of the tool. In an extension of that method the amount and direction of those motions are recorded. In reproducing the threading process the measuring may be omitted.

It is assumed for the purpose of explanation that the machine which is seen in FIG. 1 is arranged such that the tool 10 can be moved up and down in the Z direction but cannot be moved toward and away from the viewer in the Y direction and cannot be moved from side to side in the X direction. However, the table on which the workpiece will be mounted and on which the threading structure is mounted can be moved in the X and Y directions. In the first step of the process, whether making and recording measurements of tool motion or merely reproducing previously recorded motions, a reference point on the tool is placed at a reference point on the table or on a structure which is carried by and moves with the table. In the preferred method the reference point on the tool is an imaginary mark on the bottom front edge midway across the width of the tool. The reference point on the table is the point of the V-notch 24 on the ledge side 30 of the threading structure 12. Those two reference points are matched in FIG. 1.

In FIGS. 2 through 6 the bonding tool 10, the clamp 20, and the threading structure 12 are shown greatly enlarged and both the tool and the threading structure are shown sectioned. The clamp is formed by two blades lying in vertical planes directly behind the bonding tool. Only one is visible in the several Figures. The other is directly behind the one shown. In operation the bonding wire 32 extends between the two plates. By a means not shown, one plate may be urged toward the other to clamp the wire between them or moved apart to release the wire. The clamp is moveable as a unit toward and away from the tool 10 along a line of action parallel to arrow 34 and generally parallel to the direction in which the wire extends and generally parallel to the axis of the guide hole 36 of the tool 10. Thus the clamp may be and is used to force the wire through the guide hole so its end underlies the anvil in readiness for completion of the first bond of a wire run and to pull on and break the wire at the completion of a wire run.

The central region of the lower face of the tool 10 is cut away across the width of the tool to form a groove 38. The groove divides the lower, working face of the tool into a forward, anvil part 40 and a rear, heal portion 42. The guide hole 36 extends from an entrance opening at the rear of the tool, where it is enlarged to oval shape to facilitate threading, to an exit opening in the groove 38. Except that the guide hole axis may extend at an angle to the horizontal of 30 and sometimes 60 degrees, this tool and its 45 degree hole angle is typical of most tools.

Figure 2:
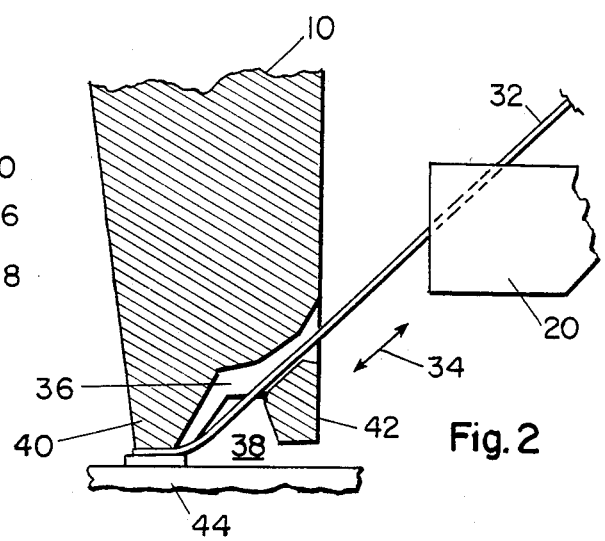
FIG. 2 is a diagram of the relationship of bonding tool, bonding wire, wire clamp and workpiece at the time of the making of the first bond of a wire run.

FIG. 2 shows the relation of the wire 32 to the tool 10 and to the clamp 20 and workpiece 44 at the time the first bond of a wire run is made. The end portion of the wire underlies the anvil of the tool its end extending approximately to the front edge of the tool face. After the wire is threaded into the guide hole it must be forced through the hole and arranged such that the wire is positioned ready for making the first bond of a wire run. The preferred method of the invention includes accomplishing that task.

In the method the wire is made to extend between the plates of the open wire clamp and to terminate at a known position where the end is held or will remain not withstanding that the tool is moved. The wire end being thus positioned, the tool and clamp are moved down to a position in which the guide opening of the tool is opposite the end of the wire. Next the clamp is closed on the wire and is moved toward the tool to force the wire into the guide hole entrance. The clamp is then released, retracted, reclamped and again moved toward the tool to drive the wire further into the guide hole. That clamp action is repeated until the wire has been driven such that its end can or does underlie the anvil. To accomplish such clamp action the wire must be disposed between the clamp blades. Thus a position in the X direction is chosen for the wire end which lies in the plane that includes the entrance opening of the tool's guide hole and which extends between the clamp blades. That presents no problem because the spool or other wire source is necessarily positioned on the machine so that the wire can move freely through the open clamp.

Before the clamp may be used to insert the wire end into the guide hole, the end of the wire or the tool must be lifted or lowered so that they are at the same level in the Z direction. Also, the tool must be moved forward or the wire end moved back to provide Y direction clearance for relative movement in the Z direction. Therefore, the coordinates of the wire end and the guide hole entry must be known with respect to some reference point. The tool and therefore the guide hole entrance are readily moved by the bonding machines drive mechanisms for a selected reference point to any specified coordinate position. That is not true of the wire. To know where the wire end is, the invention either identifies the wire end at a given place or it creates an end by cutting the wire at a given place. The latter is preferred. The wire end having been identified it is placed at a place whose coordinates are known and in the preferred method the wire end is left at the place at which the end was identified or created. As previously described, that position is to have the same X coordinate as the guide hole and the space between the clamp plates. The position of the wire end being fixed and known, the tool is moved through the difference between guide hole entry coordinates and the wire end coordinates in the Z direction and almost so in the Y direction leaving enough Y direction clearance to permit the Z direction movement.

Figure 3:
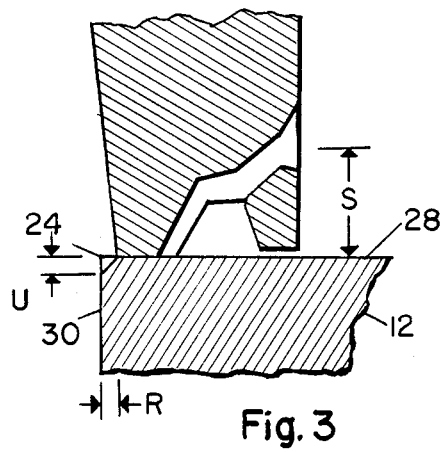
FIG. 3 is a diagram of the relation between the bonding tool and the structure used in the preferred arrangement for practicing the invention at one step of the threading process.

The preferred apparatus for accomplishing the method is shown in the drawings. The mechanisms for moving the tool and clamp from one coordinate position to another already exists in commercial form and is completely described in the patent literature so it is not repeated here. What is new is the structure that maintains the wire end in a given position so that the guide hole of the tool may be aligned with the wire end. In this preferred form that is a plate, such as plate 12 in the drawing, which forms a shelf having a mark at a reference position which is at or can be moved to the X coordinate of the guide hole opening and which is sufficiently high to permit lowering the tool below its upper, forward edge to place the guide hole opening opposite the wire end. Comparison of Figures 1 and 3 will show that notch 24 is V-shaped and is oriented such that the bottom of the notch extends in the plane perpendicular to the front wall 30 and upward at an angle between 30 and 45 degrees. When viewed through the microscope the notch is diamond shaped. The upper point is defined as the reference position. In FIG. 3 it is shown to lie at distance R from the plane of wall 30 and to extend a distance U down the face of the wall. In an initial step the tool is brought to rest with its reference point, the midpoint of its front edge, directly over the reference position. A means which forms part of the bonding machine is arranged to compute and record the amount and direction of tool movement from that position. The work table is not moved in the X direction during the process so there is no need to keep track of relative movement except in the Y and Z directions.

Figure 4:
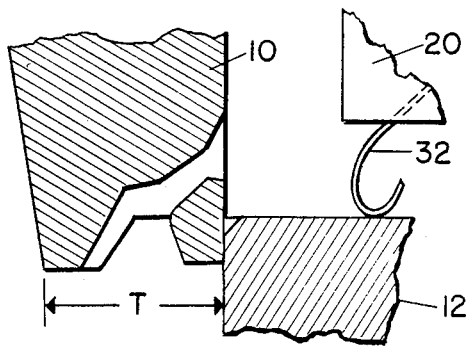
FIG. 4 is a diagram of the apparatus of FIG. 3 at a different step of the process.
Figure 5:
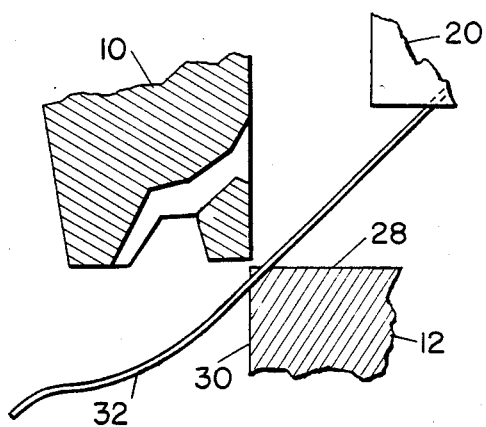
FIG. 5 is a diagram of the apparatus of FIGS. 3 and 4 at the step in the preferred process at which the wire is cut.
Figure 6:
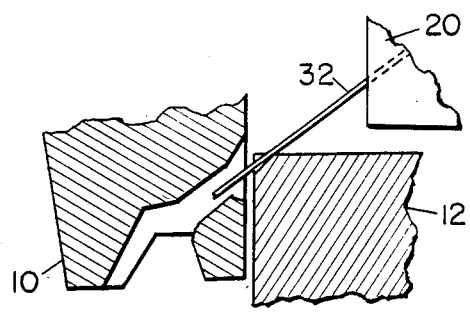
FIG. 6 is a diagram of the apparatus as it is arranged in the wire threading step of the preferred process.

In one step of the process the wire is made to extend between the blades of the clamp, or the arms which hold the blades, and its end or the standing part above the end is placed in the notch 24. If the end can be placed in the notch flush with wall 30, no more is required than to leave it there. In most cases that may be unduly difficult. If so the procedure is to draw out a length of wire longer than needed and to lay it in the groove as shown in FIG. 5. That can be done with relative ease using a tweezer to handle the wire. Next, using the machine's positioning controls, the wire is severed. That can be done by causing the rear edge of the tool's lower face to move down the surface of wall 30 as shown in FIG. 4 to shear the wire flush with the wall face. However, it is usually preferred, because the elements are more visible, to return the tool to a position just forward of the position it occupies in FIG. 3 such that the lower face of the tool presses the wire down and nicks it at the upper entrance to the notch. While the tool rests on the wire the standing part is pulled until it breaks. In the process the wire end is drawn straight.

Alternatively the lower rear edge of the tool is moved down the face of the wall 30 until it engages and nicks but does not sever the wire. While holding the wire with the edge of the tool the clamp is closed and retracted very slightly to pull and break the wire.

The depth of the tool, dimension T in FIG. 4, is known or can be measured. That is true too of the height of the guide hole entrance above the working face of the tool, dimension S in FIG. 3. Dimensions R an U are also known. The amount of any displacement of the tool during the wire severing step, and any displacement of the tool and table to clear the surfaces of the threading structure 12 are added algebraically to the R, S, T and U distances as the tool is moved to the position relative to the threading structure which it is shown to occupy in FIG. 6. The clamp is repeatedly closed on the wire and moved toward the tool and then opened to release the wire and retracted whereby to feed the wire through the hole through the predetermined distance which will permit placement of the wire end in its first bond position. By recording the several displacements of the tool in the initial threading process and causing the tool to repeat those displacements, threading the bonding machine with bonding wire is made automatic except for the step of laying the standing part of the wire in the notch 24.

In obedience to the rules, the best mode now known for practicing the invention has been shown in the accompanying drawing and described in the specification above. However, it is to be understood that other embodiments and variations of the invention are possible and that the invention is to be limited by what is defined in the appended claims rather than by what has been shown.

We claim:
1. The method of threading bonding wire into the guide hole of a wire bonding tool in the circumstance in which the coordinates of the hole relative to a reference point on the tool are known, with the aid of a structure with respect to which the tool is movable, which method comprises the steps of:
   positioning the tool such that said reference point on the tool is positioned at a reference point on said structure;
   placing the wire with which the tool is to be threaded such that its end is disposed at a position whose coordinates relative to the reference point on the structure are known;
   causing the tool to move in a degree determined as a function of the differences between the coordinates of the end of the wire and the reference point of the tool to a position in which the guide hole of the tool is opposite the end of the wire; and
   moving the wire toward the guide hole sufficiently to cause the end of the wire to enter said guide hole.
2. The method defined in claim 1 in which the wire is placed such that its end is disposed at a position whose coordinates is known by cutting the wire to form the end at said position.
3. The method defined in claim 2 in which said structure comprises a ledge and in which the reference point on said structure is a point on the ledge adjacent its edge and in which said reference point on the tool is at the front of the tool whereby the depth of the tool is determined as the distance the tool must be moved forward to clear the ledge.

4. The method defined in claim 1 in which the step of causing the tool to move in a degree determined as a function of the differences between the coordinates of the end of the wire and the reference point of the tool to a position in which the guide hole of the tool is opposite the end of the wire comprises the step of finding the distance from said guide hole to the position of the end of the wire by adding the distance from the guide hole to the bottom rear of the tool to the distance found by moving the tool from the level at which its reference position coincides with the level of the reference position of said structure to the level at which the bottom rear of the tool just clears the edge of said ledge and by adding the distance from the level of the reference position on said structure to the level of said position of the end of the wire.

5. The invention defined in claim 1 in which the step of placing the wire such that its end is disposed at a position whose coordinates is known is accomplished by using the bonding tool in parting the wire at an edge of said structure to form the end.

6. The method defined in claim 1 in which the step of causing the tool to move in a degree determined as a function of the differences between the coordinates of the end of the wire and the reference point of the tool to a position in which the guide hole of the tool is opposite the end of the wire comprises the step of finding the distance from said guide hole to the position of the end of the wire by adding the depth of the tool from the front to the rear found by moving the tool from the position in which its reference position coincides with the reference position of said structure until the rear of the tool just clears the edge of said ledge to the distance from the reference position on said structure to said position of the end of the wire.

* * * * *